(12) United States Patent
Sawanobori

(10) Patent No.: US 11,749,646 B2
(45) Date of Patent: Sep. 5, 2023

(54) SEMICONDUCTOR PACKAGE AND MANUFACTURING METHOD THEREOF

(71) Applicant: Kioxia Corporation, Tokyo (JP)

(72) Inventor: Akihito Sawanobori, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/016,594

(22) Filed: Sep. 10, 2020

(65) Prior Publication Data

US 2021/0242138 A1    Aug. 5, 2021

(30) Foreign Application Priority Data

Feb. 4, 2020 (JP) ................................. 2020-017171

(51) Int. Cl.

| H01L 25/065 | (2023.01) |
|---|---|
| H01L 23/552 | (2006.01) |
| H01L 23/00 | (2006.01) |
| H01L 23/31 | (2006.01) |
| H01L 23/498 | (2006.01) |
| H01L 21/48 | (2006.01) |
| H01L 21/56 | (2006.01) |

(52) U.S. Cl.
CPC ...... *H01L 25/0657* (2013.01); *H01L 21/4853* (2013.01); *H01L 21/4857* (2013.01); *H01L 21/565* (2013.01); *H01L 23/3121* (2013.01); *H01L 23/49822* (2013.01); *H01L 23/552* (2013.01); *H01L 24/48* (2013.01); *H01L 2224/48227* (2013.01); *H01L 2225/0651* (2013.01); *H01L 2225/06506* (2013.01); *H01L 2225/06537* (2013.01); *H01L 2225/06562* (2013.01); *H01L 2225/06582* (2013.01); *H01L 2924/3025* (2013.01)

(58) Field of Classification Search
CPC ..................................................... H01L 23/552
See application file for complete search history.

(56) References Cited

U.S. PATENT DOCUMENTS

| 7,989,928 B2 | 8/2011 | Liao et al. |
|---|---|---|
| 9,269,673 B1 * | 2/2016 | Lin ......... H01L 23/552 |
| 10,529,668 B2 | 1/2020 | Kitazaki et al. |

(Continued)

FOREIGN PATENT DOCUMENTS

| CN | 107342266 A | 11/2017 |
|---|---|---|
| JP | 2007-243122 A | 9/2007 |

(Continued)

*Primary Examiner* — Yu-Hsi D Sun
(74) *Attorney, Agent, or Firm* — Oblon, McClelland, Maier & Neustadt, L.L.P.

(57) ABSTRACT

A semiconductor package according to one embodiment comprises a substrate. A semiconductor chip is provided on the substrate. A resin layer is configured to cover the semiconductor chip on the substrate. A metal film is configured to cover a surface and side surfaces of the resin layer. The metal film is a laminated film including first to fourth metal layers. The first metal layer is configured to cover the resin layer. The second metal layer includes a first metal material that is different from a material of the first metal layer. The third metal layer includes an alloy of the first metal material forming the second metal layer and a second metal material different from the first metal material. The fourth metal layer is configured to cover the second or third metal layer.

9 Claims, 5 Drawing Sheets

(56) References Cited

U.S. PATENT DOCUMENTS

2005/0045358 A1* 3/2005 Arnold ................ H05K 9/0024
  174/51
2018/0286817 A1  10/2018 Kitazaki et al.

FOREIGN PATENT DOCUMENTS

JP  2018-170416 A  11/2018
TW     201616632 A   5/2016

* cited by examiner

SEMICONDUCTOR PACKAGE AND MANUFACTURING METHOD THEREOF

CROSS REFERENCE TO RELATED APPLICATIONS

This application is based upon and claims the benefit of priority from the prior Japanese Patent Application No. 2020-017171, filed on Feb. 4, 2020, the entire contents of which are incorporated herein by reference.

FIELD

The embodiments of the present invention relate to a semiconductor package and manufacturing method thereof.

BACKGROUND

In order to prevent EMI (Electro Magnetic Interference) generated from a semiconductor device, there is a case where a metal film is formed as an electromagnetic shield on a surface of a semiconductor package. This metal film is covered with a protection film. However, in some cases, a part of the protection film may be scraped in characteristic inspection of a semiconductor device or the like.

DETAILED DESCRIPTION

Figure 1:
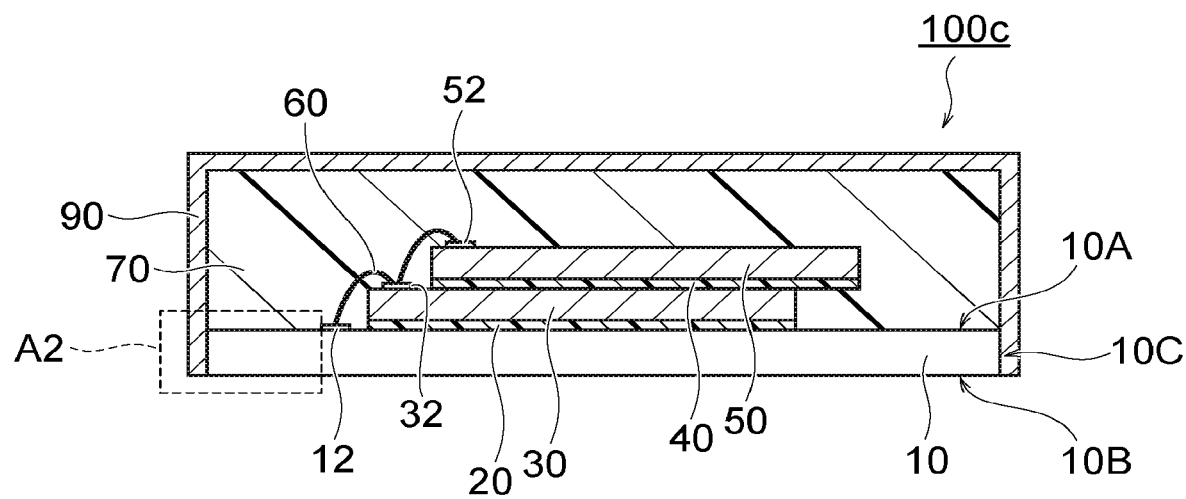
FIG. 1 is a cross-sectional view illustrating an example of a configuration of a semiconductor package according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a wiring substrate on which semiconductor chips are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor package according to one embodiment comprises a substrate. A semiconductor chip is provided on the substrate. A resin layer is configured to cover the semiconductor chip on the substrate. A metal film is configured to cover a surface and side surfaces of the resin layer. The metal film is a laminated film including first to fourth metal layers. The first metal layer is configured to cover the resin layer. The second metal layer includes a first metal material that is different from a material of the first metal layer. The third metal layer includes an alloy of the first metal material forming the second metal layer and a second metal material different from the first metal material. The fourth metal layer is configured to cover the second or third metal layer.

First Embodiment

FIG. 1 is a cross-sectional view illustrating an example of a configuration of a semiconductor package according to a first embodiment. A semiconductor package 100c seals semiconductor chips 30 and 50 therein with a resin material. Each of the semiconductor chips 30 and 50 may be a memory chip such as a NAND flash memory or a controller chip that controls memory chips, for example.

A wiring board 10 has a first surface 10A, a second surface 10B on the opposite side to the first surface 10A, and a side surface 10C provided between the first surface 10A and the second surface 10B. Wiring layers 13 to 16 (see FIG. 2) and interlayer dielectric films 17 (see FIG. 2) that insulate the wiring layers from each other are provided inside the wiring board 10. The interlayer dielectric films 17 may include glass epoxy resin or ceramics, for example. That is, the wiring board 10 may be a printed board or an interposer that uses glass epoxy resin, for example.

The semiconductor chips 30 and 50 are stacked on the first surface 10A of the wiring board 10. The semiconductor chip 30 is made to adhere onto the first surface 10A of the wiring board 10 with an adhesive layer 20. The semiconductor chip 50 is made to adhere onto the semiconductor chip 30 with an adhesive layer 40. For example, each of the adhesive layers 20 and 40 may be a paste-like or film-like resin, such as an NCP (Non Conductive Paste) or a DAF (Die Attach Film). The number of stacked semiconductor chips may be larger than two or smaller than two.

The wiring board 10 includes a pad 12 electrically connected to any of its internal wirings. The semiconductor chip 30 includes a pad 32 electrically connected to any of semiconductor elements formed on the surface of the semiconductor chip 30. The semiconductor chip 50 includes a pad 52 electrically connected to any of semiconductor elements formed on the semiconductor chip 50. The pads 12, 32, and 52 are connected to each other via a bonding wire 60, for example. The first surface 10A of the wiring board 10 except for the pad 12 is covered with an insulation film such as a solder resist (not illustrated).

A resin layer 70 seals and protects the semiconductor chips 30 and 50 and the bonding wire 60 on the wiring board 10. The resin layer 70 is not provided on the side surface 10C of the wiring board 10.

A metal film 90 covers a surface and side surfaces of the resin layer 70. The metal film 90 covers the wiring board 10 to the side surface 10C and is electrically connected to a portion of wires of the wiring board 10 on the side surface 10C.

Figure 2:
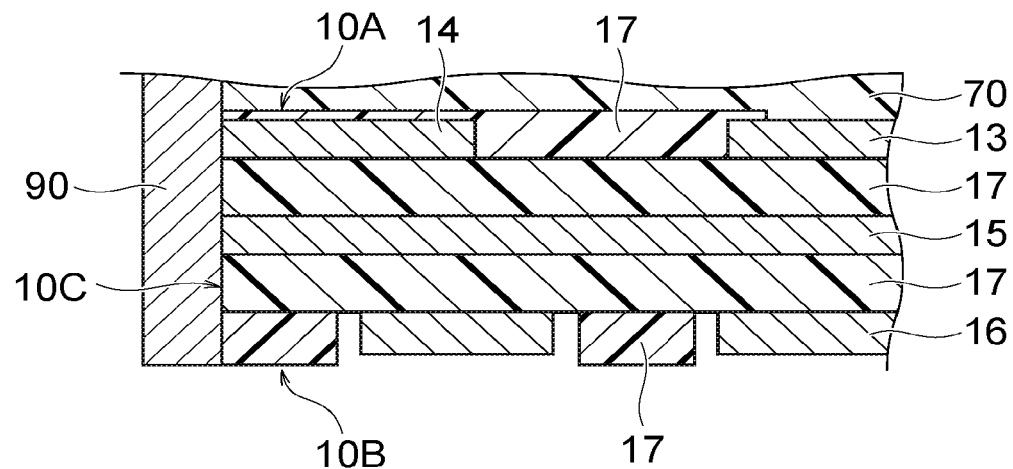
FIG. 2 is a cross-sectional view illustrating a configuration in a frame in FIG. 1 in more detail.

FIG. 2 is a cross-sectional view illustrating a configuration in a frame A2 in FIG. 1 in more detail. The wiring board 10 includes the wiring layers 13 to 16 as a portion of wiring layers. The wiring layer 16 is provided on the side close to the second surface 10B. The wiring layer 15 is provided above the wiring layer 16. The wiring layers 13 and 14 are provided above the wiring layer 15. The wiring board 10 may further include another wiring layer. The interlayer dielectric films 17 are provided between the wiring layers 13 to 16 to electrically insulate the wiring layers 13 to 16 from each other. The wiring layer 13 may be connected to the pad 12 or may function as the pad 12. The wiring layer 16 may also function as a pad on the side close to the second surface 10B.

Portions of the wiring layers 14 and 15 are exposed from the interlayer dielectric films 17 on the side surface 10C of the wiring board 10. The wiring layers 14 and 15 exposed from the interlayer dielectric films 17 are connected to, for example, a predetermined voltage (the ground, for example). The metal film 90 covers the side surface 10C of the wiring board 10 and is electrically connected to the wiring layers 14 and 15. Therefore, the metal film 90 is grounded via the wiring layers 14 and 15. Accordingly, the metal film 90 can function as an electromagnetic shield.

Figure 3:
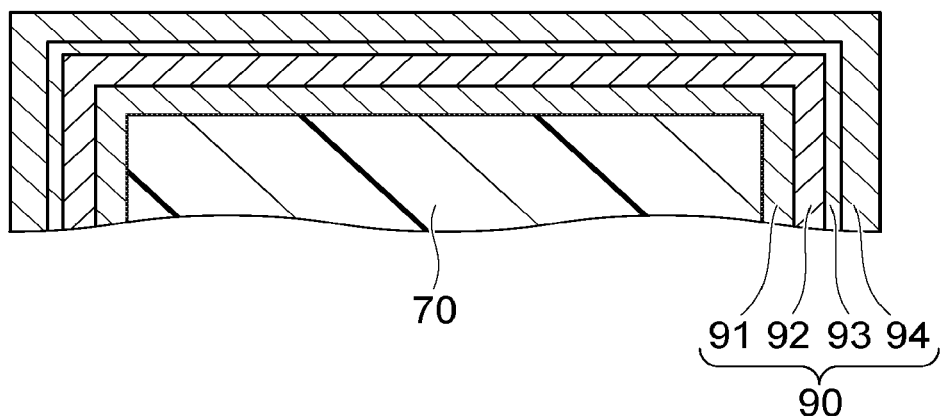
FIG. 3 is a cross-sectional view illustrating a more detailed configuration of the metal film.

FIG. 3 is a cross-sectional view illustrating a more detailed configuration of the metal film 90. Only an upper portion of the semiconductor package 100c is illustrated in FIG. 3. The metal film 90 covering a surface and side surfaces of the resin layer 70 is configured as a laminated film including a plurality of metal layers 91 to 94.

The metal layer 91 covers the surface and side surfaces of the resin layer 70. A metal material containing stainless steel, nickel, or titanium is used for the metal layer 91, for example. The thickness of the metal layer 91 is about 100 nm to 300 nm, for example.

The metal layer 92 is provided on the metal layer 91 and covers the surface and side surfaces of the resin layer 70 via the metal layer 91. The metal layer 92 includes a metal material that is different from those of the metal layers 91, 93, and 94 and has a lower resistance than those of the metal layers 91, 93, and 94. A metal material, for example, copper, nickel, or titanium is used for the metal layer 92.

The metal layer 93 is provided on the metal layer 92 and covers the surface and side surfaces of the resin layer 70 via the metal layers 91 and 92. The metal layer 93 includes an alloy of the metal material of the metal layer 92 and another metal material that is different from the metal material of the metal layer 92. As the metal layer 93, for example, there is used an alloy that includes copper, nickel, or titanium as a base material and at least one additional material selected from aluminum (Al), cobalt (Co), chromium (Cr), germanium (Ge), indium (In), magnesium (Mg), manganese (Mn), nickel (Ni), silicon (Si), tin (Sn), titanium (Ti), zinc (Zn), molybdenum (Mo), and iron (Fe). Note that, in a case where the base material is nickel, a material other than nickel is used as the additional material. Further, in a case where the base material is titanium, a material other than titanium is used as the additional material. It suffices that the additional material included in the metal layer 93 is 1 to 20 atomic percent (at. %). Accordingly, the metal layer 93 can include an alloy that includes the metal material of the metal layer 92 as a base material and another metal material as an additional material. As described above, by forming the metal layer 93 using the alloy that includes the metal material of the metal layer 92 as the base, adhesion between the metal layer 92 and the metal layer 93 is improved, so that the metal layer 93 is hard to peel off from the metal layer 92.

Further, by forming the metal layer 93 using the alloy material described above, the crystal grain size in the metal layer 93 becomes smaller than the crystal grain size in the metal layer 92. For example, the grain size in the metal layer 93 is less than 0.10 μm and the grain size in the metal layer 92 is 0.10 μm or more. By making the grain size in the metal layer 93 smaller, the crystal grain size in the metal layer 94 deposited on the metal layer 93 also becomes smaller. Since of the smaller grain size in the metal layer 94 that is the outermost layer, adhesion between the metal layer 93 and the metal layer 94 is improved, so that the metal layer 94 is hard to peel off from the metal layer 93. That is, the metal layer 94 can protect the metal layer 93 more surely. The total thickness of the metal layers 92 and 93 is about 0.45 μm to 2.5 μm, for example.

By interposing the metal layer 93 that includes the metal material of the metal layer 92 as a base and has the small grain size between the metal layer 92 and the metal layer 94, adhesion between the metal layers 92 to 94 is improved. Accordingly, even if the metal layer 94 is scratched, the metal layer 92 is hard to be exposed.

Further, the metal layer 92 is deposited at a high temperature of 150 degrees or higher, and its crystal grain size is larger than that in the metal layer 93. Since the grain size in the metal layer 92 is larger than that in the metal layer 93, a resistance value of the metal layer 92 is lower than a resistance value of the metal layer 93. Accordingly, by electrical connection of the metal layer 92 to the wiring layers 14 and 15 in FIG. 2, it is possible to improve the effect of an electromagnetic shield. The resistance value of the metal layer 92 is lower than any of those of the metal layers 91, 93, and 94. The metal layer 92 may be connected to the wiring layers 14 and 15 of the wiring board 10 directly or via the metal layer 91.

The metal layer 94 is provided on the metal layer 93 and covers the surface and side surfaces of the resin layer 70 via the metal layers 91 to 93. The metal layer 94 covers the metal layer 93 and is the outermost layer of the semiconductor package 100c. A metal material containing stainless steel, nickel, or titanium is used for the metal layer 94, for example. It suffices that the metal layer 94 includes the same material as the metal layer 91. The thickness of the metal layer 94 is about 100 nm to 300 nm, for example.

In a case where the metal layer 93 including an alloy is not provided, the grain size in the metal layer 94 becomes large because the grain size in the metal layer 92 is large, and adhesion between the metal layer 92 and the metal layer 94 becomes poor. In this case, the metal layer 92 tends to be exposed easily when the metal layer 94 is scratched.

On the other hand, according to the present embodiment, the metal film 90 covering the resin layer 70 is a laminated film of the metal layers 91 to 94. A laminated film of the metal layers 92 and 93 is provided between the metal layer 91 and the metal layer 94, and the metal layer 93 includes an alloy of the metal material of the metal layer 92 and another metal material. Accordingly, the grain sizes of the metal layers 93 and 94 are smaller than the grain size in the metal layer 92, so that adhesion between the metal layers 92 to 94 can be improved.

Further, because the grain size in the metal layer 92 is larger than that in the metal layer 93, a resistance value of the metal layer 92 is lower than a resistance value of the metal layer 93. Accordingly, the effect of an electromagnetic shield is improved. As a result, the semiconductor package 100c according to the present embodiment can improve the function of the electromagnetic shield, and can also protect the metal layer 92 surely to prevent the metal layer 92 from being exposed.

Next, a manufacturing method of the semiconductor package 100c according to the present embodiment is described.

Figure 4A:
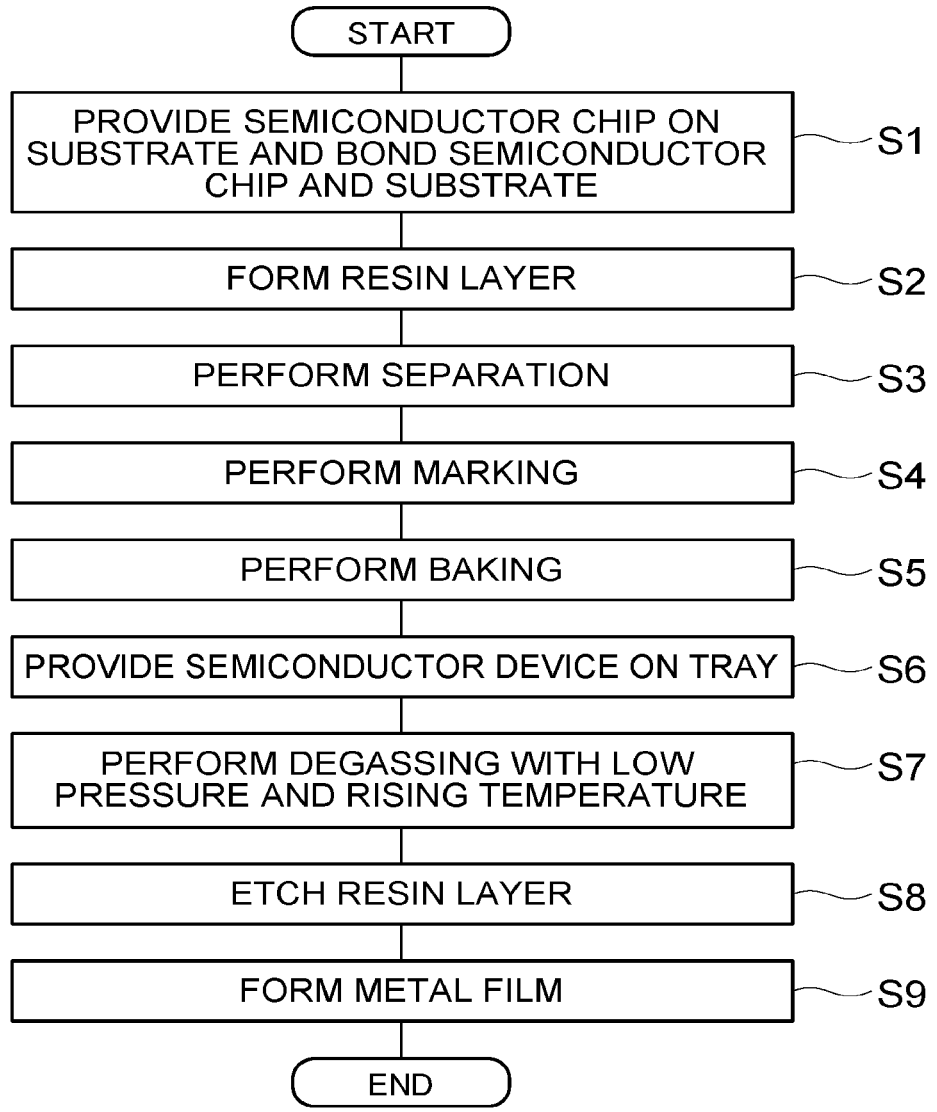
FIGS. 4A and 4B are flowcharts illustrating an example of a manufacturing method of the semiconductor package according to the first embodiment.
Figure 4B:
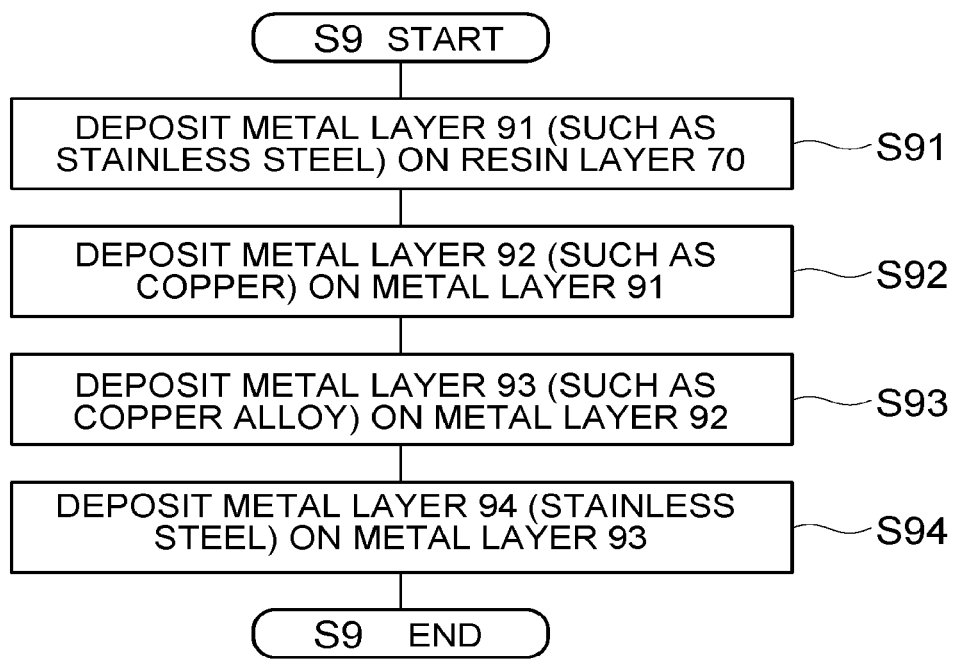

FIGS. 4A and 4B are flowcharts illustrating an example of a manufacturing method of the semiconductor package according to the first embodiment.

At Step S1 in FIG. 4A, the semiconductor chip 30 is provided on the first surface 10A of the wiring board 10 in FIG. 1 via the adhesive layer 20. On the semiconductor chip 30, the semiconductor chip 50 is provided via the adhesive layer 40. At this time, a plurality of wiring boards 10 are still joined to each other and have not been separated into individual semiconductor packages.

Next, the wiring board 10 is cleaned by plasma cleaning, and thereafter the pad 12 of the wiring board 10, the pad 32 of the semiconductor chip 30, and the pad 52 of the semiconductor chip 50 are connected to each other by the bonding wire 60. The bonding wire 60 is, for example, a metal wire such as an Au wire, a Cu wire, an Ag wire, or a Cu wire coated with Pd.

Although the semiconductor chips 30 and 50 are stacked in a direction substantially perpendicular to the first surface 10A, semiconductor chips may be arranged on the first surface 10A side by side.

Next, at Step S2, the resin layer 70 is provided on the wiring board 10 to seal the semiconductor chips 30 and 50 and the bonding wires 60. The resin layer 70 includes a thermosetting resin and may be epoxy resin or acrylic resin, for example. The resin layer 70 may include a resin material containing inorganic filler (not illustrated). The inorganic filler is silica, that is, silicon oxide, for example. The inorganic filler may include, in addition to silica, aluminum hydroxide, calcium carbonate, aluminum oxide, boron nitride, titanium oxide, or barium titanate added thereto, for example.

At Step S3, the wiring board 10 is separated into individual semiconductor packages with a blade.

At Step S4, marking is performed on a top surface of the resin layer 70 of the separated semiconductor package. The marking is performed by engraving a product name, a manufacturer, a lot number, and the like, by using a laser marker.

At Step S5, the wiring board 10 is put into an oven and is subjected to baking. Baking is performed at a temperature between 100 degrees to 260 degrees, for example. By baking, the moisture contained in the resin layer 70 can be evaporated and adhesion of the metal film 90 described later can be improved. Further, baking at a temperature equal to or lower than a melting point of solder, for example, equal to or lower than 260 degrees prevents reduction of reliability of a bonding portion, a wire, a transistor, or the like.

At Step S6, the plural wiring boards 10 are placed on a tray (not illustrated). Next, at Step S7, the wiring boards 10 are carried into a decompression chamber in which the pressure is lower than the atmospheric pressure, while being placed on the tray. The wiring boards 10 are subjected to baking at a temperature between 150 degrees to 260 degrees, for example.

Next, the wiring board 10 is transferred into an etching chamber. At Step S8, the resin layer 70 is etched in the etching chamber. The resin layer 70 is etched (by sputter etching) by using plasma including argon (Ar) and nitrogen (Ni), for example. A flow rate ratio between argon and nitrogen can be set to 3:7 to 7:3, for example. When the flow rate ratio is out of this range, adhesion between the resin layer 70 and the metal film 90 may be lowered. By this etching, the resin layer 70 is selectively etched with respect to inorganic filler in a depth of about 1 nm to 100 nm. Since the inorganic filler has high adhesion to the metal film 90, adhesion between the resin layer 70 and the metal film 90 is improved by exposing the inorganic filler.

Next, the wiring board 10 is introduced into a deposition chamber. At Step S9, the metal film 90 is formed on the top surface and side surfaces of the resin layer 70 and on the side surface 10C of the wiring board 10. The metal film 90 is formed by, for example, sputtering, while the plural wiring boards 10 are placed on the tray.

The metal film 90 is a laminated film of the metal layers 91 to 94 as described above. The metal layers 91 to 94 are continuously deposited in the same deposition chamber, while changing a material source of sputtering. First, as illustrated in FIG. 4B, the metal layer 91 is deposited on the resin layer 70 (S91). In a case of using stainless steel for the metal layer 91, for example, sputtering is performed by using a source of stainless steel. The thickness of a stainless film is 100 nm to 300 nm, for example. Next, the metal layer 92 is deposited on the metal layer 91 (S92). In a case of using copper for the metal layer 92, for example, sputtering is performed by using a source of copper. In this sputtering, a deposition temperature is 150 degrees or higher, preferably 200 degrees or more. By this sputtering, the grain size of copper in the metal layer 92 becomes larger than the grain size of copper deposited at a low temperature lower than 150 degrees. Accordingly, the metal layer 92 has a relatively low resistance.

In a case of performing sputtering for the wiring board 10 placed on a resin tape that is not resistant to a temperature of 150 degrees or higher, it is naturally necessary to deposit the metal film 90 at a temperature lower than 150 degrees. Therefore, the grain size in the metal film 90 becomes small, and its resistance value becomes relatively high.

On the other hand, in the present embodiment, sputtering is performed for the wiring board 10 placed on a tray that is resistant to a higher temperature than the resin tape. Accordingly, it is possible to deposit the metal layer 92 at a high temperature that is 150 degrees or higher, preferably 200 degrees, so that its grain size can be made large. Consequently, the metal layer 92 has a relatively low resistance.

Next, the metal layer 93 is deposited on the metal layer 92 (S93). In a case of using copper alloy for the metal layer 93, for example, sputtering is performed by using a source of copper alloy. It suffices that a temperature is lower than 150 degrees in this sputtering. By this sputtering, the grain size of copper alloy in the metal layer 93 becomes relatively small. Accordingly, adhesion between the metal layer 93 and the metal layer 92 is improved. Further, because of the small grain size, the metal layer 93 can have a relatively flat surface. The total thickness of the metal layers 92 and 93 is 0.45 μm to 2.5 μm, for example.

Next, the metal layer 94 is deposited on the metal layer 93 (S94). In a case of using stainless steel for the metal layer 94, for example, sputtering is performed by using a source of stainless steel. The thickness of a stainless film is 100 nm to 300 nm, for example. At this time, the metal layer 94 also becomes a relatively flat film having a small grain size in accordance with the underlying metal layer 93. Accordingly, adhesion between the metal layer 94 and the metal layer 93 is improved.

The metal layers 91 to 94 may be formed by CVD (Chemical Vapor Deposition), vacuum evaporation, or ion plating.

By the manufacturing method described above, the semiconductor package 100c according to the first embodiment is completed.

According to the present embodiment, the metal layer 92 is deposited at a relatively high temperature, and its grain size becomes relatively large. Accordingly, the resistance value of the metal layer 92 becomes low, so that the function as an electromagnetic shield can be improved. Meanwhile, the grain sizes in the metal layers 93 and 94 covering the metal layer 92 are smaller than the grain size in the metal layer 92. Accordingly, adhesion between the metal layers 92 to 94 is improved.

Second Embodiment

Figure 5:
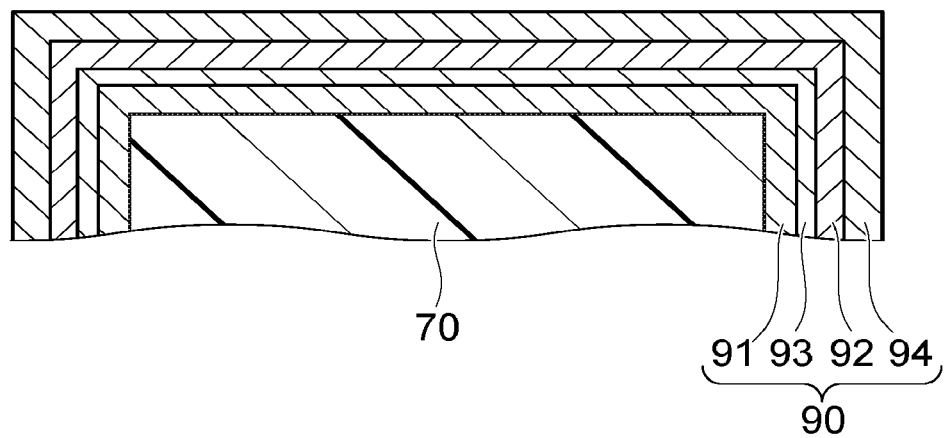
FIG. 5 is a cross-sectional view illustrating a more detailed configuration of the metal film according to a second embodiment.

FIG. 5 is a cross-sectional view illustrating a more detailed configuration of the metal film 90 according to a second embodiment. In the second embodiment, the positional relation between the metal layers 92 and 93 is reversed. That is, the metal layer 93 is provided on the metal layer 91 and the metal layer 92 is provided on the metal layer 93. The metal layer 94 is provided on the metal layer 92. Other configurations of the second embodiment may be identical to corresponding configurations of the first embodiment.

The metal layer 93 is provided on the metal layer 91 and covers a surface and side surfaces of the resin layer 70 via the metal layer 91. The material of the metal layer 93 includes an alloy that is identical to that of the metal layer 93 in the first embodiment. Accordingly, adhesion between the metal layers 93 and 92 is improved.

The metal layer 92 is deposited on the metal layer 93. Therefore, the grain size in the metal layer 92 may become smaller than that in the metal layer 92 according to the first embodiment. In this case, the grain size in the metal layer 94 formed on the metal layer 92 also becomes small, so that adhesion between the metal layer 92 and the metal layer 94 is improved. It suffices that the material of the metal layer 92 is identical to that of the metal layer 92 according to the first embodiment.

The metal layer 94 is provided on the metal layer 92 and covers the metal layer 92. It suffices that the material of the metal layer 94 is identical to that of the metal layer 94 according to the first embodiment.

According to the second embodiment, although the positional relation between the metal layers 92 and 93 is reversed among the metal layers 91 to 94, adhesion between the metal layers 92 to 94 is improved.

Further, the grain size in the metal layer 92 is smaller than that in the first embodiment. However, use of a material having a sufficiently low resistance value for the metal layer 92 can suppress the resistance value of the metal layer 92 to low. Accordingly, the effect of an electromagnetic shield can be maintained. As a result, the second embodiment can achieve effects of the first embodiment.

It suffices that the metal film 90 according to the second embodiment is formed by reversing the order of deposition of the metal layers 92 and 93 in the metal film 90 according to the first embodiment.

Third Embodiment

Figure 6:
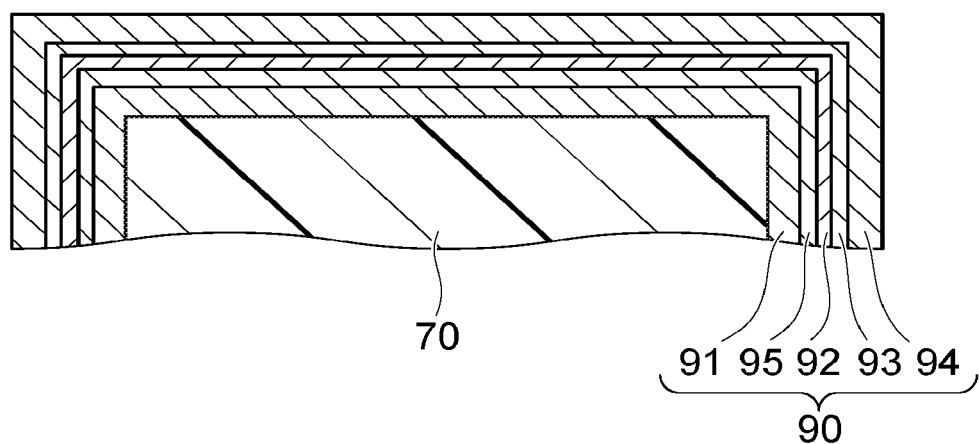
FIG. 6 is a cross-sectional view illustrating a more detailed configuration of the metal film according to a third embodiment.

FIG. 6 is a cross-sectional view illustrating a more detailed configuration of the metal film 90 according to a third embodiment. The third embodiment is different from the first embodiment in that a metal layer 95 is provided between the metal layer 91 and the metal layer 92. Other configurations of the third embodiment may be identical to corresponding configurations of the first embodiment.

The metal layer 95 is provided on the metal layer 91. The metal layer 95 is provided to cover a top surface and side surfaces of the resin layer 70 via the metal layer 91. As the metal layer 95, an alloy of a metal material of the metal layer 92 and another metal material that is different from the metal material of the metal layer 92 is used, for example. As the metal layer 95, there is used an alloy that includes copper, nickel, or titanium as a base material and at least one additional material selected from aluminum (Al), cobalt (Co), chromium (Cr), germanium (Ge), indium (In), magnesium (Mg), manganese (Mn), nickel (Ni), silicon (Si), tin (Sn), titanium (Ti), zinc (Zn), molybdenum (Mo), and iron (Fe). Note that, in a case where the base material is nickel, a material other than nickel is used as the additional material. In a case where the base material is titanium, a material other than titanium is used as the additional material. The metal layer 95 may include the same material as that of the metal layer 93 or a different material from that of the metal layer 93. The third embodiment may be regarded as a combination of the first and second embodiments.

As described above, in the third embodiment, the metal film 90 has a laminated structure of five layers, and three layers that are the metal layers 95, 92, and 93 are provided between the metal layer 91 and the metal layer 94. Accordingly, adhesion between the metal layers 92 to 95 is improved, and resistance of the metal film 90 to scratching is improved. Further, the third embodiment can achieve effects of the first and second embodiments.

It suffices that the metal film 90 according to the third embodiment is formed by depositing the metal layer 95 on the metal layer 91 under the same condition as that for deposition of the metal layer 93, before deposition of the metal layer 92 according to the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor package comprising:
   a substrate;
   a semiconductor chip provided on the substrate;
   a resin layer configured to cover the semiconductor chip on the substrate; and
   a metal film configured to cover a surface and side surfaces of the resin layer, wherein
   the metal film is a laminated film including
   a first metal layer configured to cover the resin layer,
   a second metal layer including a first metal material that is different from a material of the first metal layer,
   a third metal layer including an alloy of the first metal material forming the second metal layer and a second metal material different from the first metal material, the second metal material included in the third metal layer being 1 to 20 atomic percent (at. %), and
   a fourth metal layer configured to cover the second or third metal layer, wherein
   a grain size in the second metal layer is 0.10 μm or more,
   a grain size in the third metal layer is less than 0.10 μm,
   a total thickness of the second and third metal layers is in a range of 0.45 μm to 2.5 μm,
   a resistance value of the second metal layer is lower than resistance values of the first, third, and fourth metal layers,
   the second metal layer is provided on the first metal layer,
   the third metal layer is provided on the second metal layer, and
   the fourth metal layer is provided on the third metal layer.

2. The semiconductor package of claim 1, wherein
the third metal layer is provided on the first metal layer,
the second metal layer is provided on the third metal layer, and
the fourth metal layer is provided on the second metal layer.

3. The semiconductor package of claim 1, further comprising a fifth metal layer provided on the first metal layer and including an alloy of the first metal material and a third metal material different from the first metal material, wherein
the second metal layer is provided on the fifth metal layer,
the third metal layer is provided on the second metal layer, and
the fourth metal layer is provided on the third metal layer.

4. The semiconductor package of claim 3, wherein a grain size in the second metal layer is larger than grain sizes in the third and fifth metal layers.

5. The semiconductor package of claim 1, wherein the resistance value of the second metal layer is lower than resistance values of the first and third to fifth metal layers.

6. The semiconductor package of claim 1, wherein at least the second metal layer is provided on a side surface of the substrate and is connected to a portion of a wire of the substrate.

7. The semiconductor package of claim 1, wherein
the first metal layer includes a metal material containing stainless steel, nickel, or titanium,
the second metal layer includes a metal material containing copper, nickel, or titanium, and
the third metal layer includes an alloy including copper, nickel, or titanium as a base material and at least one additional material selected from aluminum (Al), cobalt (Co), chromium (Cr), germanium (Ge), indium (In), magnesium (Mg), manganese (Mn), nickel (Ni), silicon (Si), tin (Sn), titanium (Ti), zinc (Zn), molybdenum (Mo), and iron (Fe), where the additional material is a material other than nickel in a case where the base material is nickel, and the additional material is a material other than titanium in a case where the base material is titanium.

8. The semiconductor package of claim 1, wherein the first metal material is Cu.

9. The semiconductor package of claim 1, wherein
the first and fourth metal layers are stainless steel, and
a thickness of the first and fourth metal layers is in a range of 100 nm to 300 nm, respectively.

* * * * *